United States Patent [19]

Case et al.

[11] Patent Number: 5,008,217

[45] Date of Patent: Apr. 16, 1991

[54] PROCESS FOR FABRICATING INTEGRATED CIRCUITS HAVING SHALLOW JUNCTIONS

[75] Inventors: Christopher J. Case, New Providence; Kin P. Cheung, Hoboken; Ruichen Liu; Ronald J. Schutz, both of Warren; Richard S. Wagner, Bernardsville, all of N.J.

[73] Assignee: AT&T Bell Laboratories, Murray Hill, N.J.

[21] Appl. No.: 534,772

[22] Filed: Jun. 8, 1990

[51] Int. Cl.$^5$ ............................................ H01L 21/441
[52] U.S. Cl. .................................... 437/195; 437/192; 437/194
[58] Field of Search ...................... 437/195, 192, 966; 148/DIG. 25, DIG. 20

[56] References Cited

U.S. PATENT DOCUMENTS 4,745,089  5/1988  Orban .................................. 437/192
4,956,204  9/1990  Amazawa et al. ................. 427/252

FOREIGN PATENT DOCUMENTS 0012132  1/1988  Japan ................................. 437/192
234591  9/1988  Japan .

*Primary Examiner*—Brain E. Hearn
*Assistant Examiner*—Michael Trinh
*Attorney, Agent, or Firm*—Bruce S. Schneider

[57] ABSTRACT

Direct contact to shallow junctions in integrated circuits and interconnection between these contacts is achievable by utilizing a specific aluminum CVD process. In this process the aluminum is deposited utilizing a triisobutyl aluminum precursor onto a substrate having a nucleation layer, e.g. a titanium nitride layer. By appropriate choice of this nucleation layer to control the nucleation of the depositing aluminum, suitable contact is made while avoiding void defects present in the absence of such layer.

6 Claims, No Drawings

PROCESS FOR FABRICATING INTEGRATED CIRCUITS HAVING SHALLOW JUNCTIONS

BACKGROUND OF THE INVENTION

1. Technical Field

This invention relates to integrated circuit manufacture and, in particular, manufacture of integrated circuits having shallow junctions.

2. Art Background

In the manufacture of integrated circuits, electrical contact to junctions such as the source and drain of field effect transistors is required. For these devices desirable electrical properties include a junction contact resistance less than 10 ohms and a junction leakage current less than $10^{-7}$ amps/cm$^2$. Complexities inherent in strict design rules make satisfaction of these requirements significantly more difficult. (The device design rule is the smallest lateral dimension for all features within the device circuit.) For example, since the source and drain junctions are typically no deeper than 0.25 μm at submicron design rules, any undesirable chemical reaction with the junction induced by the fabrication process quickly destroys it. Additionally, electrical contact is made through an opening in an overlying electrical insulator material, also known as a dielectric, to the underlying junction region, e.g., drain or source junction region (an electrical insulator material is defined in C. Kittel, "Introduction to Solid State Physics, 3rd Ed." p. 252 and p. 266 (1967)). Typically, as a consequence of strict design rules, this opening (window) has a high aspect ratio, i.e., greater than 1.1. (Aspect ratio is defined as the thickness of the dielectric at the junction divided by the effective diameter of the window at the junction, i.e., the diameter of a circle having the same area as the window at the junction.) To contact the junction through a high aspect ratio opening requires deposition of a conductive material that conforms to or fills the opening so that the conducting cross-section in the window is adequate to maintain an acceptably low current density. Additionally, the same deposition that produces the contact through the window is employed to form a surface metallic layer on the dielectric, and this surface layer is ultimately patterned to form electrical interconnects between contacts. The surface layer, as a result, should not have defects that unacceptably degrade the electrical characteristic of the interconnect. Thus, in summary, to ensure a suitable contact and attendant interconnect, undesirable chemical reaction with the junction should be avoided while a coating that conforms to or fills the window should be produced and while an adequate surface deposition is obtained.

Generally, it is desirable to utilize aluminum as the electrically conductive contact and interconnect material because of its high conductivity, etchability, excellent adhesion to silicon oxide, and nominal cost. However, direct deposition of aluminum to produce a suitable coating in a window that has an aspect ratio greater than 1.1 has been an elusive goal. One relatively recent procedure involving the chemical vapor deposition using a triisobutyl aluminum precursor (see H. W. Piekaar, et al., Sixth International IEEE VLSI Multilevel Interconnect Conference, p. 122 (1989), L. F. Kwakman, et. al. *Tungsten and Other Refractory Metals for VLSI Applications IV*, p. 315, MRS (1989)) for depositing an aluminum contact in these demanding applications shows promise and is undergoing further investigation. However, since triisobutyl aluminum does not dissociate spontaneously on a dielectric material a chlorine compound, titanium tetrachloride, is used to initiate growth of the aluminum film. This procedure leaves chlorine residue at the aluminum-dielectric interface which tends to diffuse into the aluminum interconnect conductors and to cause corrosion of the conductor lines, with the resulting failure of the electronic circuit. Thus, approaches for aluminum contacts are either totally unacceptable or have some reliability considerations.

Other contact materials have been investigated. For example, the deposition of tungsten by a low pressure chemical vapor deposition (LPCVD) technique has been reported. (See, for example, N. E. Miller and I. Beinglass, *Solid State Technol.*, 25(12), 85 (1982), E. K. Broadbent and C. L. Ramiller, *J. Electrochem. Soc.*, 131, 1427 (1984), and E. K. Broadbent and W. T. Stacy, *Solid State Technol.*, 49(12), 51 (1985).) This technique has the advantage of allowing deposition into windows that have aspect ratios greater than 1.1. However, there is a substantial undesirable interaction between the junction (including a silicide overlying the silicon) and chemical entities introduced during deposition of the tungsten. (See, for example, M. L. Green and R. A. Levy, *Semicon East 1985 Technical Proceedings*, 57 (1985), M. L. Green and R. A. Levy, *J. Electrochem. Soc.*, 132, 1243 (1985), G. E. Georgiou, et al., *Tungsten and Other Refractory Metals for VLSI Applications II*, E. K. Broadbent, Editor, page 225, MRS, Pittsburgh, PA, 1987, and N. Lifshitz, et al. *Tungsten and Other Refractory Metals for VLSI Applications III*, V. A. Wells, Editor, page 225, MRS. Pittsburgh PA, 1988.) Under certain conditions this interaction is self-limiting. That is, the amount of junction silicon consumed during the deposition reaches a maximum value that depends on the reaction conditions. Despite this self-limiting effect, the damage produced is still too extensive for junctions, such as source and drain junctions, shallower than 0.25 μm. Additionally, the adhesion between the deposited tungsten material and the dielectric material, e.g., silicon dioxide, is not entirely desirable. One proposal involving tungsten deposition (N. Lifshitz and R. Shultz, U.S patent application Ser. No. 07/226,917, filed Aug. 1, 1988) has produced a suitable contact and interconnect deposition. This procedure is quite suitable for demanding applications but involves somewhat complicated processing. Thus direct, acceptable deposition of aluminum is still an alluring possibility.

SUMMARY OF THE INVENTION

It has been found that aluminum deposition by chemical vapor deposition using a triisobutyl aluminum precursor unexpectedly yields not only pin holes but also unacceptable interfacial voids, i.e. empty spaces that do not travel through the entire thickness of the aluminum interconnect layer but are present at the interface between the substrate and the deposited aluminum. These voids, and under appropriate conditions the pin holes as well, are eliminated by utilizing a nucleation layer of suitable characteristics between the deposition substrate and the deposited aluminum on the surface of the dielectric material through which windows are formed. In particular, the nucleating material utilized should be chosen such that before the aluminum deposit reaches an average thickness of 120 Å or less, the resulting aluminum grains occupy at least 97.5% of the substrate surface area. (Grains smaller than 0.15 micron in largest dimension are not considered for this area determination. Average thickness is the thickness corresponding to a uniformly thick layer of the same number of moles as in the layer being measured. Additionally, grain boundaries are not considered unoccupied area.) Materials such as titanium nitride, e.g., stoichiometric titanium nitride, and titanium nitride containing 45 to 55 atomic percent nitrogen with the remainder titanium, as well as metals deposited in a high vacuum environment, produce the desired result. In particular, use of nucleation layers that do not involve chlorine avoids the chlorine-induced corrosion of aluminum interconnect.

DETAILED DESCRIPTION

The deposition of aluminum to conformally fill window holes with aspect ratios greater than 1.1 is described in H. W. Piekaar, et al., *Sixth International IEEE VLSI Multilevel Interconnection (V-MIC) Conference*, pg. 122 (1989), which is hereby incorporated by reference. Basically, this procedure involves utilizing a purified triisobutyl aluminum precursor and introducing this precursor to the deposition substrate heated to a temperature in the range 200° C. to 400° C. The triisobutyl aluminum (TIBA) is carefully treated to substantially reduce organic impurities. TIBA liquid flow rates in the range 20 to 80 ml/min at a temperature in the range 35° to 70° C. and TIBA partial pressures in the range 20-70 Pa are typically employed. As previously discussed through this procedure, conformal window contact is produced, but substantial interfacial void defects are also obtained.

To avoid interfacial void defects, a nucleation layer is first formed on the substrate before deposition of the aluminum. However, the nucleation layer should be carefully chosen such that before the aluminum deposit reaches an average thickness of 120 Å or less on the nucleating material, the resulting aluminum grains occupy at least 97.5% of the substrate area. (Grains smaller than 0.15 micron in largest dimension as well as artifacts such as whiskers are not considered for this area determination.) For a titanium nitride nucleation layer deposited in a chamber previously evacuated to a high vacuum with a stoichiometric composition or containing 45 to 55 atomic percent nitrogen with the remainder titanium this criterion is satisfied while for a layer composition produced by exposing the wafer to titanium tetrachloride introduced in a chamber previously evacuated to a pressure of $2 \times 10^{-4}$ Pa, it is not. It has been found that voids are avoided with the former while a substantial level of voids, e.g., greater than approximately $10^6$ per cm$^2$, are obtained with the latter. (The nucleation grain coverage is easily discerned through scanning electron microscopy done at appropriate intervals on a control sample and the average thickness is determined by weighing the deposition substrate before and after these intervals.)

A variety of materials formed under conditions that avoid the substantial formation of native oxides yield the appropriate aluminum nucleation criterion. Exemplary of suitable nucleation materials is titanium nitride preferably having a nitrogen content in the range between 45 to 55 atomic percent and metals such as titanium. Generally doses of oxidizing agents greater than 0.1 Torr-sec for titanium nitride and $10^{-4}$ Torr-sec for metals such as titanium tend to yield excessive oxidation. For example, titanium exposed to a vacuum of $2 \times 10^{-4}$ Pa or worse for approximately 2 hours generally yields poor nucleation with whisker growth while titanium deposited in a vacuum of $2 \times 10^{-5}$ Pa for less than 1 minute leads to films that satisfy the above-cited criterion. Thus typically nucleation layers such as titanium nitride and metals should generally be formed in a relatively high vacuum environment and should not be subsequently exposed to an oxidizing medium before deposition of the aluminum.

Conventional deposition techniques are available for depositing a nucleation layer. For example, titanium nitride is deposited by reactive sputtering as described by D. S. Williams, et al., *Journal of Vacuum Science and Technology B*, Vol. 5, p. 1723-1729 (1987), and titanium or other metals are deposited by sputtering as described in "Handbook of Thin Film Technology", edited by L. I. Maissel and R. Glang, McGraw-Hill (1970), Chapter 4, "Application of Sputtering to the Deposition of Films". Typically, a nucleation layer having a thickness in the range 0.005 μm to 0.15 μm is employed. Layers thinner than 0.005 μm generally have excessive discontinuities while layers thicker than 0.15 μm are undesirable because they are generally of high electrical resistance and thus will increase the total electrical resistance of the interconnect lines.

Although the precise mechanism leading to the resulting absence of voids is unknown, a contemplated explanation is that significant oxide on the nucleating surface substantially hinders the β-hydride elimination required for deposition of aluminum from a triisobutyl aluminum precursor. Sporadic nucleation induced by the presence of oxide leads to relatively large grains separated by empty spaces when these grains coalesce. Thus, it is believed that the surprising formation of voids occurs due to unacceptable nucleation and it is cured by the use of a nucleating layer that satisfies the nucleation requirements described.

By a particularly judicious choice of nucleation layer deposition conditions, not only are voids essentially eliminated but also pin holes are substantially reduced. For example, the use of a Ti$_x$N$_y$ where x and y are 1.0 and 1.0±0.05 respectively, deposited in an appropriate environment produces a void free layer having a pin hole destiny lower than $3 \times 10^3$ cm$^{-2}$ (the detection limit of typical instruments such as scanning electron microscope after examining several hundred sample areas). Similarly, titanium layers deposited and maintained under high vacuum conditions with subsequent deposition of aluminum at 230° and 270° C. also produce a void free surface while reducing the pin hole level below $3 \times 10^4$ cm$^{-2}$, (the detection limit of a scanning electron microscope after examining 20 sample areas). Although many films satisfying the desired criterion exhibit the substantial reduction of pin holes, some exceptions such as substantially increased pinhole densities at approximately 250° C. deposition temperature on non-stoichiometric TiN and titanium are observed. The precise reason for these exceptions is not yet fully understood. Generally, the density of pinholes seems to be most reduced at aluminum deposition temperatures of approximately 270° C.

The following example is illustrative of the invention.

EXAMPLE

A Chemical Vapor Deposition (CVD) system was used for Aluminum (Al) deposition. The CVD system had a hexagonal central robotic wafer handling chamber (WHC). On each side of the hexagon there was a gate valve through which a separate vacuum chamber was connected to the WHC. Three of such chambers were respectively an input-output chamber (IOC) with a 25 wafer capacity, a CVD reactor and a sputter deposition chamber (SDC). Each of these chambers was individually pumped by a turbo molecular pump except for SDC and CVD reactor. The SDC was pumped by a cryogenic pump and the CVD reactor was pumped by a combination of cryogenic pump and mechanical pump boosted by a roots blower.

Silicon wafers 5 inches in diameter and with a <100> orientation having a 1000 Å thermal oxide layer were cleaned with a sulfuric acid/$H_2O_2$ 5:1 mixture at 115° C. before loading into the IOC. The IOC was then evacuated. At a total pressure in the IOC of $3 \times 10^{-4}$ Pa or below, the isolating gate valve that connected the IOC to the WHC opened. The robotic arm in the WHC transferred a wafer from the IOC to the WHC. A mild increase of pressure from $2 \times 10^{-5}$ Pa to $6 \times 10^{-5}$ Pa in the WHC occurred. The isolating gate valve was then closed and the pressure in the WHC quickly returned to $2 \times 10^{-5}$ Pa. The gate valve that separated the SDC from the WHC was then opened and the robotic arm delivered the wafer into the SDC. The SDC pressure increased from $3 \times 10^{-6}$ Pa to $2 \times 10^{-5}$ Pa. The gate valve was then closed after the robotic arm retreated and the pressure in the SDC quickly returned to $3 \times 10^{-6}$ Pa.

A mixture of argon and nitrogen gas (7:3 by volume) was used for sputtering with a high purity titanium target to form a TiN film. Both the argon and the nitrogen were individually controlled by a mass flow controller. The gases were premixed before entering the SDC. A total flow rate of 30 standard cubic centimeters per minute was used. With the full pumping speed of a 6 inch cryogenic pump, a pressure of 50 Pa resulted. The sputtering was accomplished with a DC magnetron unit and with a 10 inch diameter target. The power level was 2 kilowatts and the sputtering duration was 55 seconds. No bias voltage or heating was applied to the wafer. A TiN layer of 900 Å thickness resulted. The film was golden in color with a resistivity of 70 microhm-centimeter. Rutherford Backscattering Analysis indicated that the TiN film was stoichiometric with undetectable impurity.

After the sputter deposition, the gas flow was terminated and the pressure in the SDC returned to the $10^{-6}$ Pa range in seconds. The gate valve between the SDC and the WHC opened and the wafer was transferred by the robotic arm to the WHC and then to the CVD reactor which was opened to the WHC during the time the sputter deposition of TiN was taking place. The CVD reactor was a batch process type reactor with a capacity of 25 wafers. The robotic arm was capable of loading a wafer into any desired slot location of the reactor by coordinating with the cassette location control of the reactor. After one wafer was loaded into the cassette in the reactor, another wafer was prepared in the manner described above. After all 25 wafers were prepared with a TiN nucleation layer and loaded into the CVD reactor, the reactor was isolated from the WHC. The wafers were allowed to sit in the reactor for 20 minutes to come to thermal equilibrium while the reactor was being purged with purified hydrogen. The reactor included a stainless steel tube which was heated with a 5-zone resistant heating element. Triisobutyl aluminum (TIBA) was introduced into the reactor in gaseous form by first passing through an evaporator. The TIBA gas flow was regulated by controlling the TIBA liquid entering the evaporator and by the temperature of the evaporator.

The deposition time was about 35 minutes as defined by the starting and stopping time of TIBA gas flow. This starting and stopping was achieved by a gate valve between the reactor and the evaporator. The TIBA liquid flow rate was 40 ml/min, and the evaporator was set at 45° C. The pressure in the reactor was maintained at a pressure that yields a growth rate of about 140 Å/min.

An aluminum film of about 5000 Å thickness was produced. This film exhibited a nominal reflectivity of 60% relative to an aluminum mirror. The reflectivity was measured with a Nanospec at 400 nm wavelength using an objective that has a 0.45 numerical aperture. The thickness was measured with a balance to determine the weight of the wafer before and after CVD deposition. The film resistivity was similar to that of a bulk pure aluminum metal as measured with a 4-point probe.

This film was examined under a Scanning Electron Microscope (SEM). Both surface profile and cross-section were examined carefully. Upon examining about 200 locations on the surface at a magnification of 5000 X, no pin-holes were detected. For cross-section examination, the magnification was set at 7000 X, and the entire cross-section of a 6 mm wide sample was carefully scanned. No voids were detected under this condition. It is therefore assumed that as grown, aluminum film had no pin-holes (or had pin-hole density less than $3 \times 10^3$ per square cm) or voids (or had a void density less than $5 \times 10^4$ per square cm).

We claim:

1. A process for fabricating a device comprising the steps of forming active regions of said device, forming a dielectric over said active regions, forming windows through said dielectric, electrically contacting said active region through said windows, and forming a metal pattern on said dielectric characterized in that a nucleation layer is formed between said dielectric and said metal pattern and said electrical contact and said metal for said metal pattern is deposited by chemical vapor deposition with a triisobutyl aluminum precursor wherein said nucleation layer comprises a material whose composition produces coverage by aluminum grains larger than 0.15 $\mu$m of at least 97.5% of said nucleating material surface before said aluminum has an average thickness of 120 Å.

2. The process of claim 1 wherein said dielectric comprises silicon dioxide.

3. The process of claim 2 wherein said nucleating material comprises titanium nitride.

4. The process of claim 1 wherein said nucleating material comprises $Ti_xN_y$ where x and y are in the ranges respectively of 0.45 to 0.55 and 0.45 to 0.55.

5. The process of claim 1 wherein said nucleating material comprises an elemental metal.

6. The process of claim 5 wherein said metal comprising titanium.

* * * * *